United States Patent
Lee

(10) Patent No.: US 7,525,339 B2
(45) Date of Patent: Apr. 28, 2009

(54) SEMICONDUCTOR MEMORY DEVICE TESTING ON/OFF STATE OF ON-DIE-TERMINATION CIRCUIT DURING DATA READ MODE, AND TEST METHOD OF THE STATE OF ON-DIE-TERMINATION CIRCUIT

(75) Inventor: Hyong-yong Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/717,959

(22) Filed: Mar. 14, 2007

(65) Prior Publication Data

US 2007/0222476 A1 Sep. 27, 2007

(30) Foreign Application Priority Data

Mar. 21, 2006 (KR) .................. 10-2006-0025678

(51) Int. Cl.
 *H03K 17/16* (2006.01)
(52) U.S. Cl. .................. 326/30; 326/21; 365/198; 365/230.03
(58) Field of Classification Search .................. 326/30; 365/201, 191, 189.01
See application file for complete search history.

(56) References Cited

U.S. PATENT DOCUMENTS

| | | | |
|---|---|---|---|
| 5,831,467 A * | 11/1998 | Leung et al. ............... | 327/319 |
| 6,349,059 B1 * | 2/2002 | Bartoli et al. .......... | 365/185.12 |
| 6,356,106 B1 * | 3/2002 | Greeff et al. ................. | 326/30 |
| 6,809,546 B2 | 10/2004 | Song et al. | |
| 6,844,754 B2 * | 1/2005 | Yamagata .................... | 326/30 |
| 6,928,007 B2 * | 8/2005 | Jin ............................. | 365/194 |
| 7,034,565 B2 | 4/2006 | Lee | |
| 7,068,064 B1 * | 6/2006 | Yen ............................. | 326/30 |
| 7,154,295 B2 * | 12/2006 | Choe ........................... | 326/30 |
| 7,288,959 B1 * | 10/2007 | Lee .............................. | 326/30 |
| 2003/0197525 A1 | 10/2003 | Song et al. | |
| 2004/0100837 A1 * | 5/2004 | Lee ............................ | 365/200 |

FOREIGN PATENT DOCUMENTS

| | | |
|---|---|---|
| KR | 2003-0083237 | 10/2003 |
| KR | 10-0464437 | 12/2004 |
| KR | 10-0468728 | 1/2005 |
| KR | 10-0528164 | 11/2005 |

* cited by examiner

*Primary Examiner*—Vibol Tan
(74) *Attorney, Agent, or Firm*—Mills & Onello LLP

(57) ABSTRACT

A semiconductor memory device for testing whether an ODT circuit is on or off during a data read mode includes an on-die termination (ODT) circuit and an ODT state information output unit. The ODT circuit includes at least one ODT resistor. The ODT state information output unit outputs an ODT state information signal indicating whether the ODT circuit is on or off, in response to an ODT control signal during a data read mode when data is output from memory cells. With a semiconductor memory device and method capable of testing whether an ODT resistor is on or off during a data read mode, it is possible to test whether an ODT circuit is on or off during reading of data.

44 Claims, 5 Drawing Sheets

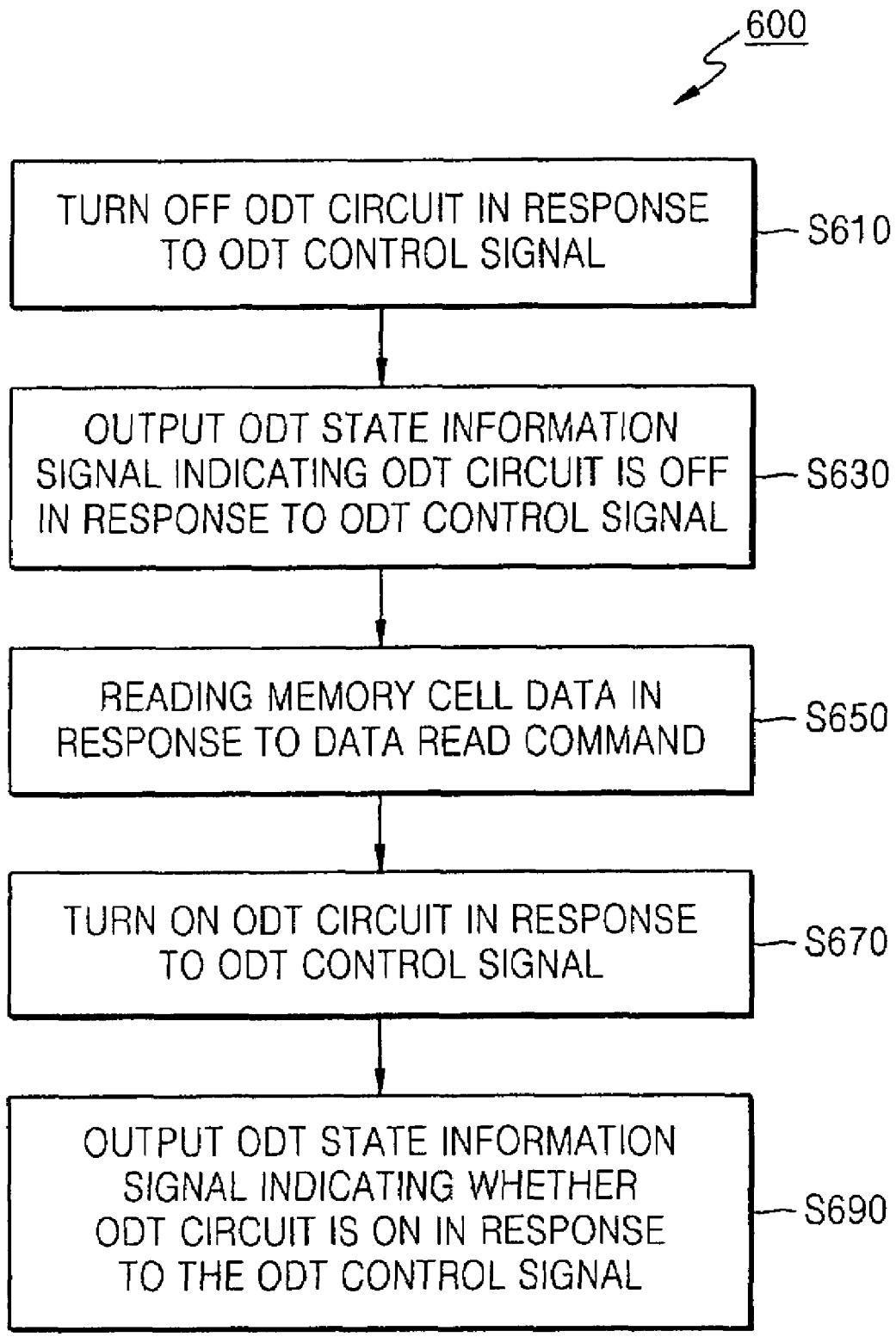

SEMICONDUCTOR MEMORY DEVICE TESTING ON/OFF STATE OF ON-DIE-TERMINATION CIRCUIT DURING DATA READ MODE, AND TEST METHOD OF THE STATE OF ON-DIE-TERMINATION CIRCUIT

CROSS-REFERENCE TO RELATED PATENT APPLICATIONS

This application claims priority from Korean Patent Application No. 10-2006-0025678, filed on Mar. 21, 2006, in the Korean Intellectual Property Office, the contents of which are incorporated herein in their entirety by reference.

BACKGROUND OF THE INVENTION

1. Field of the Invention

The present invention relates to a semiconductor memory device with an on-die termination (ODT) circuit, and more particularly, to a semiconductor memory device and method capable of testing an on/off state of an on-die termination (ODT) circuit during a data read mode.

2. Description of the Related Art

A termination resistor that terminates a bus is generally used to provide impedance matching in systems that exchange signals. The termination resistor increases the integrity of a received signal by suppressing the reflection of the signal.

The termination resistor may be located outside or inside a semiconductor memory device. A termination resistor located in a semiconductor memory device is referred to as an on-die termination (ODT) resistor. Also, a circuit that includes and controls the ODT resistor is referred to as an ODT circuit.

FIG. 1 is a block diagram of a conventional semiconductor memory device 100 with an ODT circuit 130. Referring to FIG. 1, the conventional semiconductor memory device 100 includes the ODT circuit 130, an ODT pad 180, and an input/output (I/O) pad 190.

The ODT circuit 130 includes first and second ODT resistors R1 and R2 and first and second switches S1 and S2. When the first switch S1 is on, i.e., closed, the first ODT resistor R1 is connected to an ODT voltage source VDDQ. When the second switch S2 is on, the second ODT resistor R2 is connected to a ground voltage source VSSQ. The first and second switches S1 and S2 are turned on/off in response to an external control signal received via the ODT pad 180.

While the ODT circuit 130 is on, if data is read from the conventional semiconductor memory device 100, the accuracy of the read data is not guaranteed. Thus, the ODT circuit 130 must be turned off while a data read operation is performed. Also, in order to determine accuracy of the read data, it is important to determine whether the ODT circuit 130 is off during the data read operation.

However, the conventional semiconductor memory device 100 can recognize only the resistance values of the first and second ODT resistors R1 and R2 when a data read operation is not being performed. Accordingly, the conventional semiconductor memory device 100 is not capable of determining whether the ODT circuit 130 is on or off during the data read operation.

SUMMARY OF THE INVENTION

The present invention provides a semiconductor memory device capable of testing whether an on-die termination (ODT) circuit is on or off during a data read mode.

The present invention also provides a method of testing whether an on-die termination (ODT) circuit is on or off during a data read mode.

According to an aspect of the present invention, there is provided a semiconductor memory device with a plurality of memory cells, comprising: an on-die termination (ODT) circuit including at least one ODT resistor; and an ODT state information output unit outputting an ODT state information signal indicating whether the ODT circuit is on or off in response to an ODT control signal, during a data read mode in which memory cell data is output from the memory cells.

In one embodiment, the ODT state information signal is output before or after a period when the memory cell data is output. When the data read mode is a burst read mode, the ODT state information output unit can output the ODT state information signal before first memory cell data from among the memory cell data is read and after last memory cell data is read during a burst operation.

In one embodiment, the ODT state information signal is output via a data input/output pad by which the memory cell data is output.

In one embodiment, the ODT state information output unit outputs the ODT state information signal, when an ODT detection enable signal indicating output of the ODT state information and the ODT control signal are activated. The memory device can further comprise a Mode Register Set (MRS) output unit outputting an ODT detection enable signal in response to an MRS command.

In one embodiment, the ODT circuit is turned on or off in response to the ODT control signal. The ODT circuit can be turned on or off in response to an ODT enable signal synchronized with the ODT control signal, and in response to an inversion ODT enable signal of the ODT enable signal. The ODT circuit can include: first and second ODT resistors which are electrically connected to a data input/output pad; a first switch electrically connecting the first ODT resistor to a predetermined ODT voltage source, in response to the inversion ODT enable signal; and a second switch electrically connecting the second ODT resistor to a ground voltage source, in response to the ODT enable signal. The ODT state information output unit can output the inversion ODT enable signal having the same logic state as the ODT state information signal, in synchronization with a period when the ODT detection enable signal indicating output of the ODT state information and the ODT control signal are activated. The ODT state information output unit can include: a NAND gate performing a NAND operation on the ODT detection enable signal and an ODT detection signal, and outputting the operation result; and a transmission gate outputting the inversion ODT enable signal as the ODT state information signal in a period when the output of the NAND gate is activated.

In one embodiment, the memory device further comprises: a latency controller outputting an ODT detection signal when the ODT control signal is activated or deactivated. The ODT state information output unit can output the ODT state information signal in response to the ODT detection signal. The ODT detection signal can be an automatic pulse generated so as to be synchronized with an instance of time when the ODT control signal is activated or deactivated.

In one embodiment, the memory device further comprises a data output buffer outputting the memory cell data and the ODT state information signal.

According to another aspect of the present invention, there is provided a method of testing a state of an on-die termination (ODT) circuit of a semiconductor memory device which includes the ODT circuit having at least one ODT resistor, and a plurality of memory cells, the method comprising:

turning off the ODT circuit in response to an ODT control signal; and outputting an ODT state information signal indicating whether the ODT circuit is off in response to the ODT control signal, during a data read mode when memory cell data is output from the memory cells.

In one embodiment, outputting the ODT state information signal comprises outputting the ODT state information signal before or after a period when the memory cell data is output. In one embodiment, when the data read mode is a burst read mode, outputting the ODT state information signal comprises outputting the ODT state information signal before first memory cell data is read from the memory cell data is read and after last memory cell data is read during a burst operation.

In one embodiment, the ODT state information signal is output via a data input/output pad by which the memory cell data is output.

In one embodiment, the method further comprises, after outputting the ODT state information signal, reading the memory cell data in response to a data read command. In one embodiment, the method further comprises, after the reading of the memory cell data, turning on the ODT circuit in response to the ODT control signal. In one embodiment, after turning on the ODT circuit, outputting the ODT state information signal, which indicates whether the ODT circuit is on, is performed again in response to the ODT control signal.

In one embodiment, outputting the ODT state information signal comprises outputting the ODT state information signal when an ODT detection enable signal indicating output of ODT state information, and the ODT control signal are activated.

In one embodiment, the method further comprises outputting the ODT detection enable signal in response to an MRS command.

In one embodiment, turning off the ODT circuit comprises turning off the ODT circuit in response to a data read command. In one embodiment, turning off the ODT circuit comprises turning off the ODT circuit, in response to an ODT enable signal synchronized with the ODT control signal and an inversion ODT enable signal of the ODT enable signal. In one embodiment, outputting the ODT state information signal comprises outputting the inversion ODT enable signal having the same logic state as the ODT state information signal, in synchronization with a period where the ODT detection enable signal indicating output of the ODT state information and the ODT control signal are activated. In one embodiment, outputting the ODT state information signal comprises: performing a NAND operation on the ODT detection enable signal and an ODT detection signal, and outputting the operation result; and outputting the inversion ODT enable signal as the ODT state information signal in a period where the operation result is activated.

In one embodiment, the method further comprises outputting the ODT detection signal when the ODT control signal is activated or deactivated. Outputting the ODT state information signal can include outputting the ODT state information signal in response to the ODT detection signal.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

FIG. 6 is a flowchart of a method of testing whether an ODT circuit is on or off during a data read mode, according to an embodiment of the present invention.

DETAILED DESCRIPTION OF THE INVENTION

Figure 1:
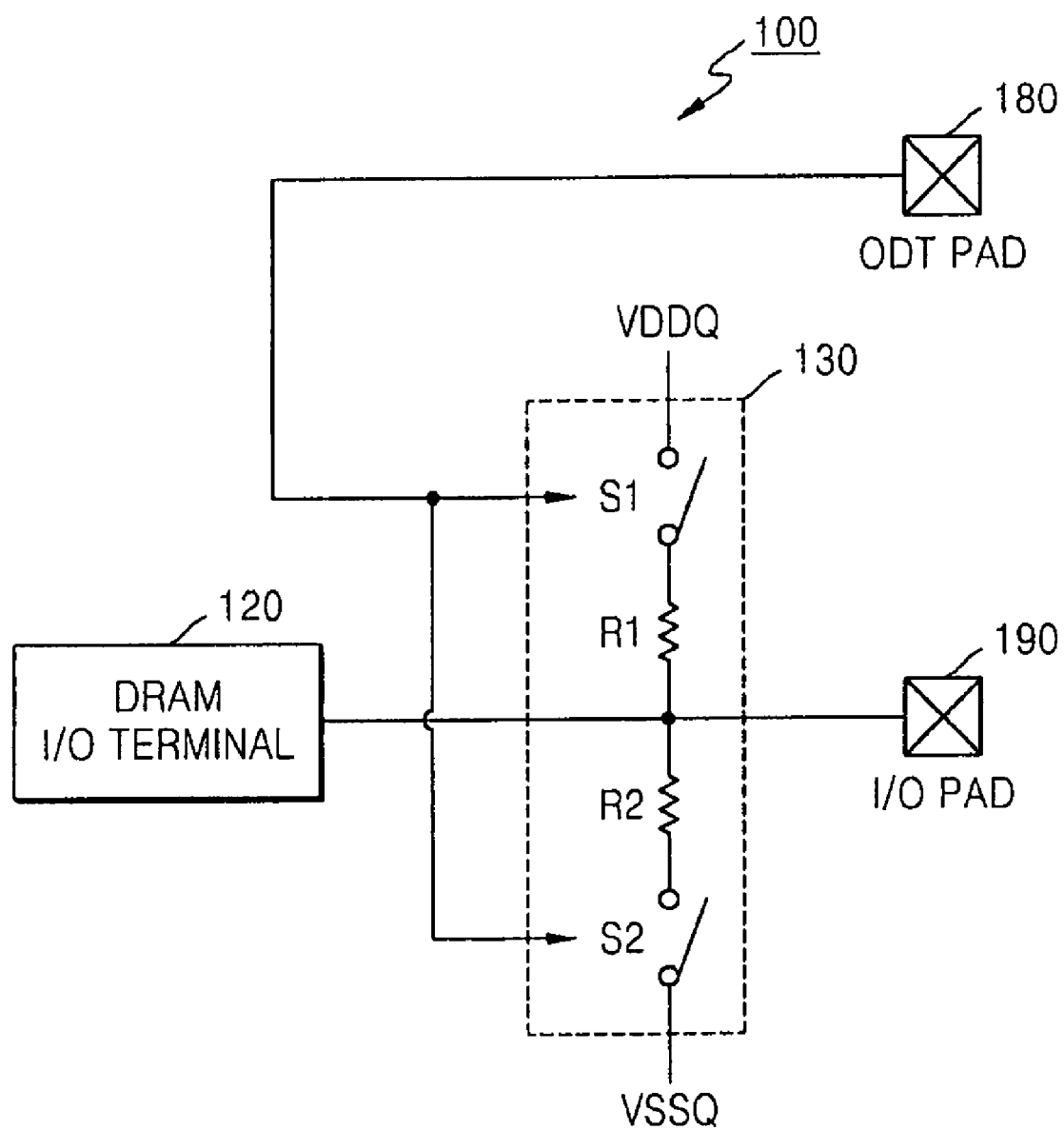
FIG. 1 is a block diagram of a conventional semiconductor memory device with an on-die termination (ODT) circuit.
Figure 2:
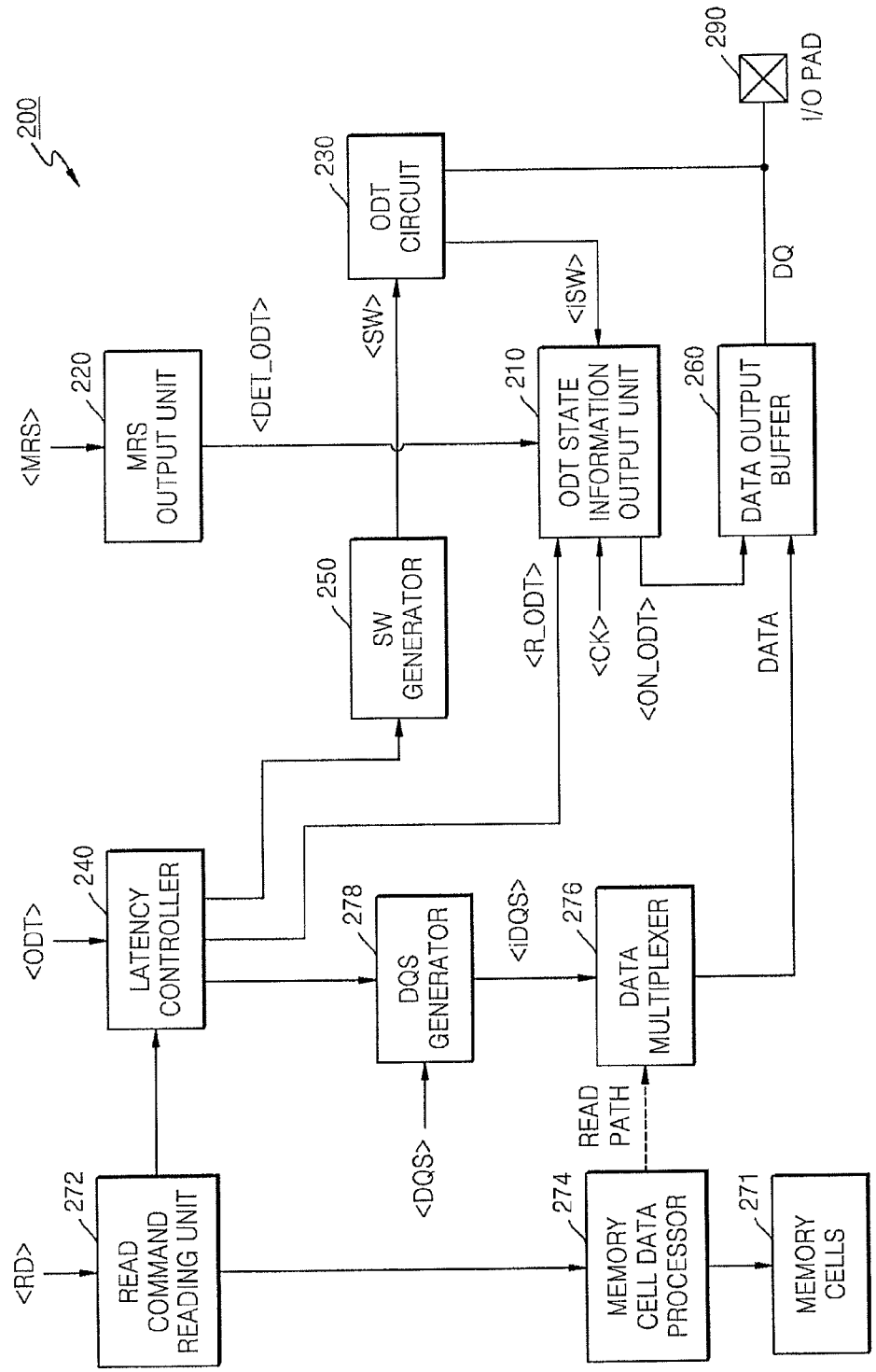
FIG. 2 is a block diagram of a semiconductor memory device capable of testing whether an ODT circuit is on or off during a data read mode, according to an embodiment of the present invention.

FIG. 2 is a block diagram of a semiconductor memory device 200 capable of testing whether an on-die termination (ODT) circuit 230 is on or off during a data read mode, according to an embodiment of the present invention. Referring to FIG. 2, the semiconductor memory device 200 includes the ODT circuit 230 and an ODT state information output unit 210.

The ODT circuit 230 includes at least one ODT resistor. The ODT state information output unit 210 outputs an ODT state information signal ON_ODT indicating whether the ODT circuit 230 is on or off, in response to an ODT control signal ODT, during a data read mode when data is output from memory cells 271.

The ODT state information output unit 210 is capable of outputting the ODT state information signal ON_ODT before or after a period in which output data is output. If a data read mode is a burst read mode, the ODT state information output unit 210 can output the ODT state information signal ON_ODT before first memory cell data is read and after final memory cell data is read during a burst operation. The ODT state information signal ON_ODT may be output via a data input/output (I/O) pad 290 whereby output data is output.

The ODT state information output unit 210 may output the ODT state information signal ON_ODT when an ODT detection enable signal DET_ODT indicating the output of ODT state information and the ODT control signal ODT are activated.

The ODT circuit 230 may be turned on or off in response to the ODT control signal ODT. Otherwise, the ODT circuit 230 may be turned on or off, in response to an ODT enable signal SW synchronized with the ODT control signal ODT, and an inversion ODT enable signal iSW of the ODT enable signal SW.

According to an embodiment of the present invention, the semiconductor memory device 200 may further include a Mode Register Set (MRS) output unit 220. The MRS output unit 220 outputs the ODT detection enable signal DET_ODT in response to an MRS instruction MRS.

According to an embodiment of the present invention, the semiconductor memory device 200 may further include a latency controller 240. The latency controller 240 outputs an ODT detection signal R_ODT when the ODT control signal ODT is activated. The ODT state information output unit 210 is capable of outputting the ODT state information signal ON_ODT in response to the ODT detection signal R_ODT.

According to an embodiment of the present invention, the semiconductor memory device 200 may further include a data output buffer 260. The data output buffer 260 outputs memory cell data DATA and the ODT state information signal ON_ODT via the I/O pad 290.

The memory cell data DATA output from a memory cell 271 is sequentially transmitted to a memory cell data processor 274, a data multiplexer 276, and finally, to the data output buffer 260, under control of a read command reading unit 272.

Figure 3:
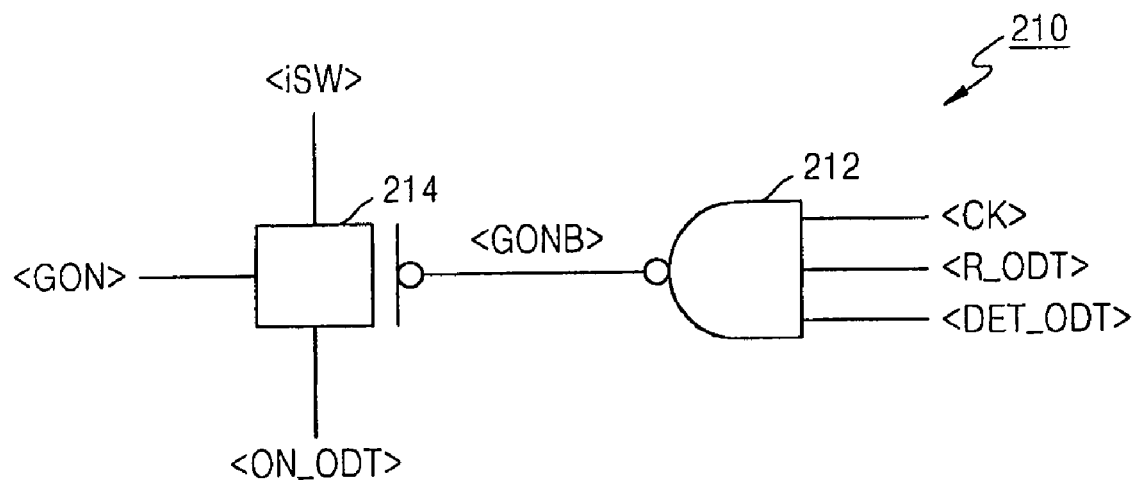
FIG. 3 is a circuit diagram of an ODT state information output unit of FIG. 2.

FIG. 3 is a circuit diagram of the ODT state information output unit 210 of FIG. 2. Referring to FIG. 3, the ODT state information output unit 210 is capable of outputting an ODT state information signal ON_ODT that is to be synchronized with a period in which an ODT detection enable signal DET_ODT indicating an ODT state information output mode and an ODT control signal ODT are activated. The logic level of the ODT state information signal ON_ODT is equal to that of an inversion ODT enable signal iSW in a period in which the ODT detection enable signal DET_ODT and the ODT control signal ODT are simultaneously activated. The inversion ODT enable signal iSW turns the ODT circuit 230 on or off as described above.

The ODT state information output unit 210 may further include a NAND gate 212 and a transmission gate 214. The NAND gate 212 performs a NAND operation on a clock signal CK, an ODT detection enable signal DET_ODT, and an ODT detection signal R_ODT, and outputs the operation result. The transmission gate 214 receives the inversion ODT enable signal iSW and outputs the ODT state information signal ON_ODT in a period in which a signal GONB output from the NAND gate 212 is activated.

Figure 4:
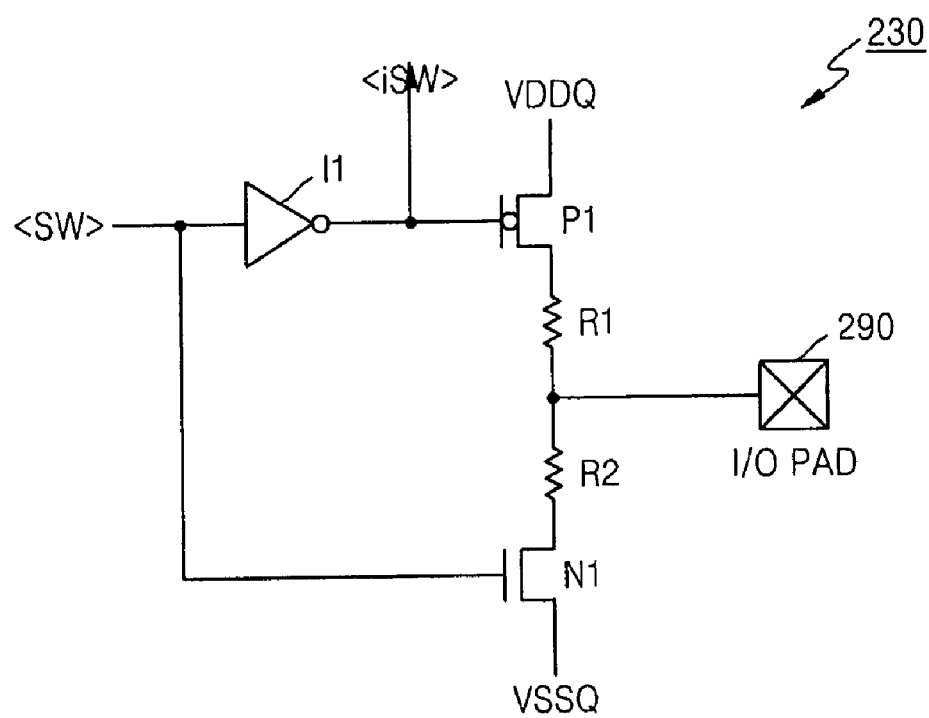
FIG. 4 is a circuit diagram of the ODT circuit of FIG. 2.

FIG. 4 is a circuit diagram of the ODT circuit 230 of FIG. 2. Referring to FIG. 4, the ODT circuit 230 may include a first ODT resistor R1, a second ODT resistor R2, a first switch P1, and a second switch N1. The first and second ODT resistors R1 and R2 are electrically connected to a data I/O pad 290.

The first switch P1 electrically connects the first ODT resistor R1 to an ODT voltage source VDDQ in response to an inversion ODT enable signal iSW. The second switch N1 electrically connects the second ODT resistor R2 to a ground voltage source VDDQ in response to an ODT enable signal SW. Referring to FIG. 4, the first switch P1 is embodied as a PMOS transistor, and the second switch N1 is embodied as an NMOS transistor.

When the ODT enable signal SW that goes logic low is input to the ODT circuit 230, the first switch P1 and the second switch N1 are turned off, and thus, the ODT circuit 230 is turned off. When the ODT enable signal SW that goes logic high is input to the ODT circuit 230, the first switch P1 and the second switch N1 are turned on, and thus, the ODT circuit 230 is turned on.

Also, the ODT circuit 230 may further include an inverter I1 that inverts the ODT enable signal SW and outputs the inversion ODT enable signal iSW.

Figure 5:
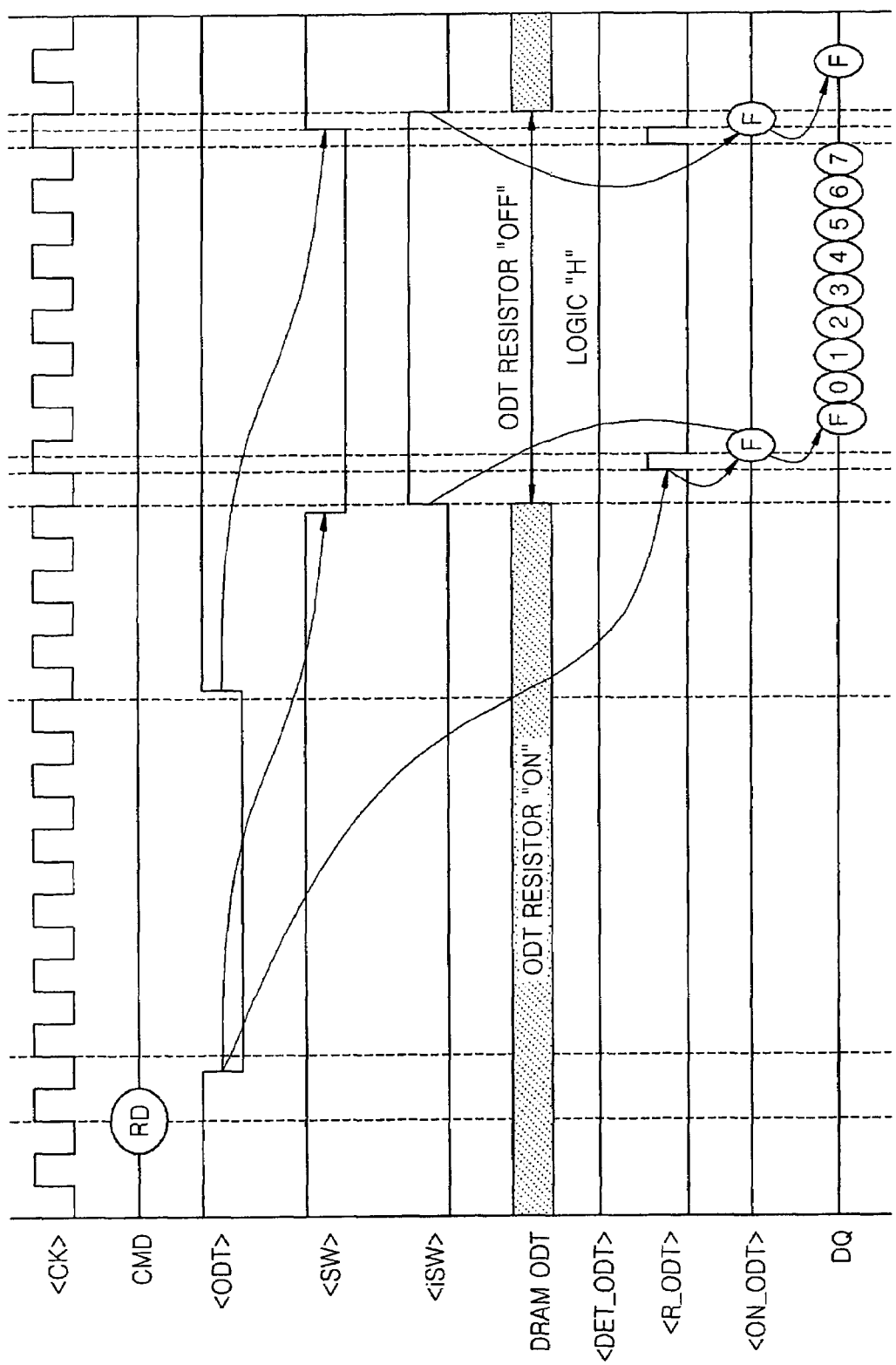
FIG. 5 is a timing diagram of signals in the semiconductor memory device of FIG. 2.

FIG. 5 is a timing diagram of various signals in the semiconductor memory device 200 of FIG. 2 according to an embodiment of the present invention.

The operation of the semiconductor memory device 200 according to an embodiment of the present invention will now be described with reference to FIG. 5. In FIG. 5, it is assumed that a read latency RL is a 10-clock period and a burst length BL is 8. Also, it is assumed that various signals are activated to a logic high level or a logic low level.

A read command RD is applied to the semiconductor memory device 200, and an ODT control signal ODT that turns off the ODT circuit 230 is activated to the logic low level. The ODT control signal ODT is activated in a period of time, corresponding to the burst length BL, during which memory cell data can be read (BL=8). That is, referring to FIG. 5, the ODT control signal ODT is activated for a period of time during which eight pieces of memory cell data can be output. Also, the ODT control signal ODT may be activated for a predetermined time margin, before or after a period which corresponds to the burst length BL and in which memory cell data can be read. Here, the predetermined time margin denotes an amount of time during which the ODT state signal ON_ODT can be output.

The ODT detection signal R_ODT is generated when the logic level of the ODT control signal ODT changes. That is, the generation of the ODT detection signal R_ODT is triggered by the ODT control signal ODT. Also, the ODT detection signal R_ODT may be an automatic pulse signal generated so as to be synchronized with a rising edge or a falling edge of the ODT control signal ODT. Since the ODT control signal ODT is activated for a period of time (which corresponds to the burst length BL) during which memory cell data DATA can be read, the ODT detection signal R_ODT is generated before first memory cell data DATA0 is read and after last memory cell data DATA7 is read during a burst operation.

Accordingly, the ODT state signal ON_ODT is at a predetermined logic state before and after a plurality of pieces of output data are output during the burst operation. Here, the predetermined logic state indicates a logic level for determining whether the ODT circuit 230 is on or off. For example, the ODT state signal ON_ODT may be at a logic high level when the ODT circuit 230 is on, and at a logic low level when the ODT circuit 230 is off.

An output signal DQ is output via the data output buffer 260 and the I/O pad 290. That is, the ODT state signal ON_ODT is read as the output signal DQ before or after the memory cell data DATA is read.

Referring to FIGS. 2 and 5, the ODT state signal ON_ODT may be generated in response to an ODT enable signal SW or an inversion ODT enable signal iSW. More specifically, the ODT enable signal SW that is activated to logic low and the inversion ODT enable signal iSW that is activated to logic high are activated so as to be in synchronization with a period when the ODT control signal ODT is activated.

Referring to FIG. 3, a transmission gate control signal GONB that goes logic low is generated by the NAND gate 212 in a period when the ODT detection signal R_ODT, the ODT detection enable signal DET_ODT, and the clock signal CK are at a logic high level. Thus, the transmission gate 214 is on, and the ODT state signal ON_ODT having the same logic level as the inversion ODT enable signal iSW is output. As described above, the ODT circuit 230 may be turned on or off, in response to the ODT enable signal SW that is synchronized with the ODT control signal ODT, and the inversion ODT enable signal iSW. Therefore, the ODT state signal ON_ODT having the same logic level as the inversion ODT enable signal iSW may indicate whether the ODT circuit 230 is on or off.

That is, according to an embodiment of the present invention, during a data read mode, the semiconductor memory device 200 may output memory cell data corresponding to the burst length BL, together with information that indicates whether the ODT circuit 230 is on or off.

FIG. 6 is a flowchart of a method 600 of testing whether an ODT circuit is on or off during a data read mode, according to an embodiment of the present invention. Referring to FIG. 6, the method 600 includes turning off the ODT circuit (step S610) and outputting an ODT state information signal (step S630). In step S610, the ODT circuit is turned off in response to an ODT control signal. In step S630, the ODT state information signal indicating whether the ODT circuit is off in response to the ODT control signal is output during a data read mode in which memory cell data is output from memory cells 271.

The method 600 may further include reading the memory cell data in response to a data read command (step S650), after the outputting of the ODT state information signal (step S630).

According to an embodiment of the present invention, the method 600 may further include turning on the ODT circuit in response to the ODT control signal (step S670), after the reading of the memory cell data (step S650).

According to an embodiment of the present invention, in the method 600, the outputting of the ODT state information signal indicating whether the ODT circuit is on in response to the ODT control signal (step S690) may be performed again, after the turning on of the ODT circuit (step S670).

The method 600 according to the present invention is applicable to the above described semiconductor memory device 200 according to the present invention and corresponds to the operation of the semiconductor memory device 200. Accordingly, those of ordinary skill in the art would readily understand the method 600 according to the present invention from the above description, and therefore, a detailed description thereof the method 600 is not repeated here.

As described above, with a semiconductor memory device and method for testing an on/off state of an ODT circuit during a data read mode, according to the present invention, it is possible to test whether the ODT circuit is on or off during reading of data.

While this invention has been particularly shown and described with reference to exemplary embodiments thereof, it will be understood by those skilled in the art that various changes in form and details may be made the rein without departing from the spirit and scope of the invention as defined by the appended claims.

What is claimed is:

1. A semiconductor memory device with a plurality of memory cells, comprising:
    an on-die termination (ODT) circuit including at least one ODT resistor; and
    an ODT state information output unit outputting an ODT state information signal indicating whether the ODT circuit is on or off in response to an ODT control signal, during a data read mode in which memory cell data is output from the memory cells,
    wherein the ODT state information output unit outputs the ODT state information signal when an ODT detection enable signal indicating output of the ODT state information and the ODT control signal are activated.

2. The semiconductor memory device of claim 1, wherein the ODT state information signal is output before or after a period when the memory cell data is output.

3. The semiconductor memory device of claim 2, wherein, when the data read mode is a burst read mode, the ODT state information output unit outputs the ODT state information signal before first memory cell data from among the memory cell data is read and after last memory cell data is read during a burst operation.

4. The semiconductor memory device of claim 1, further comprising a Mode Register Set (MRS) output unit outputting the ODT detection enable signal in response to an MRS command.

5. The semiconductor memory device of claim 1, wherein the ODT circuit is turned on or off in response to the ODT control signal.

6. The semiconductor memory device of claim 5, wherein the ODT circuit is turned on or off in response to an ODT enable signal synchronized with the ODT control signal, and in response to an inversion ODT enable signal of the ODT enable signal.

7. The semiconductor memory device of claim 6, wherein the ODT circuit comprises:
    first and second ODT resistors which are electrically connected to a data input/output pad;
    a first switch electrically connecting the first ODT resistor to a predetermined ODT voltage source, in response to the inversion ODT enable signal; and
    a second switch electrically connecting the second ODT resistor to a ground voltage source, in response to the ODT enable signal.

8. The semiconductor memory device of claim 7, wherein the ODT state information output unit outputs the inversion ODT enable signal having the same logic state as the ODT state information signal, in synchronization with a period when the ODT detection enable signal indicating output of the ODT state information and the ODT control signal are activated.

9. The semiconductor memory device of claim 8, wherein the ODT state information output unit comprises:
    a NAND gate performing a NAND operation on the ODT detection enable signal and an ODT detection signal, and outputting the operation result; and
    a transmission gate outputting the inversion ODT enable signal as the ODT state information signal in a period when the output of the NAND gate is activated.

10. The semiconductor memory device of claim 1, further comprising a latency controller outputting an ODT detection signal when the ODT control signal is activated or deactivated, wherein the ODT state information output unit outputs the ODT state information signal in response to the ODT detection signal.

11. The semiconductor memory device of claim 10, wherein the ODT detection signal is an automatic pulse generated so as to be synchronized with an instance of time when the ODT control signal is activated or deactivated.

12. The semiconductor memory device of claim 1, further comprising a data output buffer outputting the memory cell data and the ODT state information signal.

13. The semiconductor memory device of claim 12, wherein the ODT state information signal is output by the data output buffer to a data input/output pad by which the memory cell data is output.

14. A method of testing a state of an on-die termination (ODT) circuit of a semiconductor memory device which includes the ODT circuit having at least one ODT resistor, and a plurality of memory cells, the method comprising:
    turning off the ODT circuit in response to an ODT control signal; and
    outputting an ODT state information signal indicating whether the ODT circuit is off in response to the ODT control signal, during a data read mode when memory cell data is output from the memory cells,
    wherein outputting the ODT state information signal comprises outputting the ODT state information signal when an ODT detection enable signal indicating output of ODT state information and the ODT control signal are activated.

15. The method of claim 14, wherein outputting the ODT state information signal comprises outputting the ODT state information signal before or after a period when the memory cell data is output.

16. The method of claim 15, wherein, when the data read mode is a burst read mode, outputting the ODT state information signal comprises outputting the ODT state information signal before first memory cell data is read from the memory cell data is read and after last memory cell data is read during a burst operation.

17. The method of claim 14, wherein the ODT state information signal is output by a data output buffer to a data input/output pad by which the memory cell data is output.

18. The method of claim 14, further comprising, after outputting the ODT state information signal, reading the memory cell data in response to a data read command.

19. The method of claim 18, further comprising, after reading the memory cell data, turning on the ODT circuit in response to the ODT control signal.

20. The method of claim 18, wherein, after turning on the ODT circuit, outputting the ODT state information signal, which indicates whether the ODT circuit is on, is performed again in response to the ODT control signal.

21. The method of claim 14, further comprising outputting the ODT detection enable signal in response to an MRS command.

22. The method of claim 14, wherein turning off the ODT circuit comprises turning off the ODT circuit in response to a data read command.

23. The method of claim 22, wherein turning off the ODT circuit comprises turning off the ODT circuit, in response to an ODT enable signal synchronized with the ODT control signal and an inversion ODT enable signal of the ODT enable signal.

24. The method of claim 23, wherein outputting the ODT state information signal comprises outputting the inversion ODT enable signal having the same logic state as the ODT state information signal, in synchronization with a period where the ODT detection enable signal indicating output of the ODT state information and the ODT control signal are activated.

25. The method of claim 24, wherein outputting the ODT state information signal comprises:
 performing a NAND operation on the ODT detection enable signal and an ODT detection signal, and outputting the operation result; and
 outputting the inversion ODT enable signal as the ODT state information signal in a period where the operation result is activated.

26. The method of claim 14, further comprising outputting the ODT detection signal when the ODT control signal is activated or deactivated, wherein outputting the ODT state information signal comprises outputting the ODT state information signal in response to the ODT detection signal.

27. A semiconductor memory device with a plurality of memory cells, comprising:
 an on-die termination (ODT) circuit including at least one ODT resistor; and
 an ODT state information output unit outputting an ODT state information signal indicating whether the ODT circuit is on or off in response to an ODT control signal, during a data read mode in which memory cell data is output from the memory cells, wherein the ODT state information signal is output before or after a period when the memory cell data is output, and wherein, when the data read mode is a burst read mode, the ODT state information output unit outputs the ODT state information signal before first memory cell data from among the memory cell data is read and after last memory cell data is read during a burst operation.

28. A semiconductor memory device with a plurality of memory cells, comprising:
 an on-die termination (ODT) circuit including at least one ODT resistor; and
 an ODT state information output unit outputting an ODT state information signal indicating whether the ODT circuit is on or off in response to an ODT control signal, during a data read mode in which memory cell data is output from the memory cells, wherein the ODT circuit is turned on or off in response to the ODT control signal, and wherein the ODT circuit is turned on or off in response to an ODT enable signal synchronized with the ODT control signal, and in response to an inversion ODT enable signal of the ODT enable signal.

29. The semiconductor memory device of claim 28, wherein the ODT circuit comprises:
 first and second ODT resistors which are electrically connected to a data input/output pad;
 a first switch electrically connecting the first ODT resistor to a predetermined ODT voltage source, in response to the inversion ODT enable signal; and
 a second switch electrically connecting the second ODT resistor to a ground voltage source, in response to the ODT enable signal.

30. The semiconductor memory device of claim 29, wherein the ODT state information output unit outputs the inversion ODT enable signal having the same logic state as the ODT state information signal, in synchronization with a period when the ODT detection enable signal indicating output of the ODT state information and the ODT control signal are activated.

31. The semiconductor memory device of claim 30, wherein the ODT state information output unit comprises:
 a NAND gate performing a NAND operation on the ODT detection enable signal and an ODT detection signal, and outputting the operation result; and
 a transmission gate outputting the inversion ODT enable signal as the ODT state information signal in a period when the output of the NAND gate is activated.

32. A semiconductor memory device with a plurality of memory cells, comprising:
 an on-die termination (ODT) circuit including at least one ODT resistor; and
 an ODT state information output unit outputting an ODT state information signal indicating whether the ODT circuit is on or off in response to an ODT control signal, during a data read mode in which memory cell data is output from the memory cells;
 a latency controller outputting an ODT detection signal when the ODT control signal is activated or deactivated, wherein the ODT state information output unit outputs the ODT state information signal in response to the ODT detection signal.

33. The semiconductor memory device of claim 32, wherein the ODT detection signal is an automatic pulse generated so as to be synchronized with an instance of time when the ODT control signal is activated or deactivated.

34. A method of testing a state of an on-die termination (ODT) circuit of a semiconductor memory device which includes the ODT circuit having at least one ODT resistor, and a plurality of memory cells, the method comprising:
 turning off the ODT circuit in response to an ODT control signal; and
 outputting an ODT state information signal indicating whether the ODT circuit is off in response to the ODT control signal, during a data read mode when memory cell data is output from the memory cells, wherein outputting the ODT state information signal comprises outputting the ODT state information signal before or after a period when the memory cell data is output, and wherein, when the data read mode is a burst read mode, outputting the ODT state information signal comprises outputting the ODT state information signal before first memory cell data is read from the memory cell data is read and after last memory cell data is read during a burst operation.

35. A method of testing a state of an on-die termination (ODT) circuit of a semiconductor memory device which includes the ODT circuit having at least one ODT resistor, and a plurality of memory cells, the method comprising:

turning off the ODT circuit in response to an ODT control signal;

outputting an ODT state information signal indicating whether the ODT circuit is off in response to the ODT control signal, during a data read mode when memory cell data is output from the memory cells; and after outputting the ODT state information signal, reading the memory cell data in response to a data read command.

36. The method of claim 35, further comprising, after reading the memory cell data, turning on the ODT circuit in response to the ODT control signal.

37. The method of claim 35, wherein, after turning on the ODT circuit, outputting the ODT state information signal, which indicates whether the ODT circuit is on, is performed again in response to the ODT control signal.

38. A method of testing a state of an on-die termination (ODT) circuit of a semiconductor memory device which includes the ODT circuit having at least one ODT resistor, and a plurality of memory cells, the method comprising:

turning off the ODT circuit in response to an ODT control signal; wherein turning off the ODT circuit comprises turning off the ODT circuit in response to a data read command; and outputting an ODT state information signal indicating whether the ODT circuit is off in response to the ODT control signal, during a data read mode when memory cell data is output from the memory cells, wherein turning off the ODT circuit comprises turning off the ODT circuit in response to a data read command.

39. The method of claim 38, wherein turning off the ODT circuit comprises turning off the ODT circuit, in response to an ODT enable signal synchronized with the ODT control signal and an inversion ODT enable signal of the ODT enable signal.

40. The method of claim 39, wherein outputting the ODT state information signal comprises outputting the inversion ODT enable signal having the same logic state as the ODT state information signal, in synchronization with a period where the ODT detection enable signal indicating output of the ODT state information and the ODT control signal are activated.

41. The method of claim 40, wherein outputting the ODT state information signal comprises:

performing a NAND operation on the ODT detection enable signal and an ODT detection signal, and outputting the operation result; and outputting the inversion ODT enable signal as the ODT state information signal in a period where the operation result is activated.

42. A method of testing a state of an on-die termination (ODT) circuit of a semiconductor memory device which includes the ODT circuit having at least one ODT resistor, and a plurality of memory cells, the method comprising:

turning off the ODT circuit in response to an ODT control signal;

outputting an ODT state information signal indicating whether the ODT circuit is off in response to the ODT control signal, during a data read mode when memory cell data is output from the memory cells; and outputting the ODT detection signal when the ODT control signal is activated or deactivated, wherein outputting the ODT state information signal comprises outputting the ODT state information signal in response to the ODT detection signal.

43. A semiconductor memory device with a plurality of memory cells, comprising:

an on-die termination (ODT) circuit including at least one ODT resistor; and an ODT state information output unit outputting an ODT state information signal indicating whether the ODT circuit is on or off in response to an ODT control signal, during a data read mode in which memory cell data is output from the memory cells, wherein the ODT state information output unit outputs the ODT state information signal, when an ODT detection enable signal indicating output of the ODT state information and the ODT control signal are activated.

44. A method of testing a state of an on-die termination (ODT) circuit of a semiconductor memory device which includes the ODT circuit having at least one ODT resistor, and a plurality of memory cells, the method comprising:

turning off the ODT circuit in response to an ODT control signal; and outputting an ODT state information signal indicating whether the ODT circuit is off in response to the ODT control signal, during a data read mode when memory cell data is output from the memory cells, wherein outputting the ODT state information signal comprises outputting the ODT state information signal when an ODT detection enable signal indicating output of ODT state information and the ODT control signal are activated.

* * * * *